US006751743B1

(12) United States Patent
Theodoras, II et al.

(10) Patent No.: US 6,751,743 B1
(45) Date of Patent: Jun. 15, 2004

(54) METHOD AND APPARATUS FOR SELECTING A FIRST CLOCK AND SECOND CLOCK FOR FIRST AND SECOND DEVICES RESPECTIVELY FROM AN UP-CONVERTED CLOCK AND AN ALIGNED CLOCK FOR SYNCHRONIZATION

(75) Inventors: James T. Theodoras, II, Plano, TX (US); Matthew L. Heston, Plano, TX (US)

(73) Assignee: Cisco Technology, Inc., San Jose, CA (US)

( * ) Notice: Subject to any disclaimer, the term of this patent is extended or adjusted under 35 U.S.C. 154(b) by 674 days.

(21) Appl. No.: 09/746,323

(22) Filed: Dec. 22, 2000

(51) Int. Cl.[7] .............................. G06F 1/12; G06F 1/04; H04L 7/00; H03L 7/00
(52) U.S. Cl. ................ 713/400; 713/500; 713/501; 713/503; 331/18; 331/25; 375/359; 375/362; 375/371
(58) Field of Search ................ 713/400, 500, 713/501, 503; 331/25, 18; 375/359, 362, 371

(56) References Cited

U.S. PATENT DOCUMENTS

| | | | | |
|---|---|---|---|---|
| 5,408,266 A | * | 4/1995 | Ikeyama et al. | 348/222.1 |
| 5,509,037 A | * | 4/1996 | Buckner et al. | 375/371 |
| 6,084,479 A | * | 7/2000 | Duffy et al. | 331/17 |
| 6,201,448 B1 | * | 3/2001 | Tam et al. | 331/25 |
| 6,362,670 B1 | * | 3/2002 | Beaulieu | 327/156 |
| 6,446,146 B1 | * | 9/2002 | Yamaguchi et al. | 710/100 |
| 6,625,559 B1 | * | 9/2003 | Helder | 702/117 |

FOREIGN PATENT DOCUMENTS

JP  11297089 A  * 10/1999 ........... G11C/16/06

OTHER PUBLICATIONS

Scheytt, J.C.; Hanke, G.; Langmann, U.; "A 0.155–, 0.622–, and 2.488–Gb/s automatic bit–rate selecting clock and data recovery IC for bit–rate transparent SDH systems", Solid–State Ckts., IEEE Jnl. of, vol. 34; Iss.: 12, Dec. 1999, pp: 1935–1943.*

* cited by examiner

Primary Examiner—Thomas Lee
Assistant Examiner—James K Trujillo
(74) Attorney, Agent, or Firm—Campbell Stephenson Ascolese LLP

(57) ABSTRACT

A method and apparatus for synchronizing clocks is provided that is flexible and compensates for process, voltage, and temperature (PVT) variations and other timing differences between two devices. The present invention includes producing an up-converted clock from a system clock, the up-converted clock having a frequency that is a multiple of the frequency of the system clock, producing an aligned clock from a data-aligned clock from a first device and a counter clock from a second device, producing a de-jittered clock, selecting a first reference clock to send to the first device from the up-converted clock, the aligned clock and the de-jittered clock, and selecting a second reference clock to send to the second device from the up-converted clock, the aligned clock and the de-jittered clock.

27 Claims, 7 Drawing Sheets

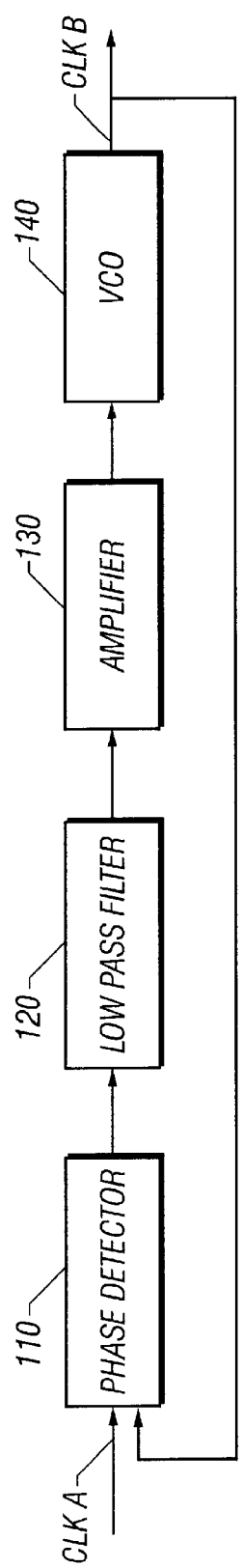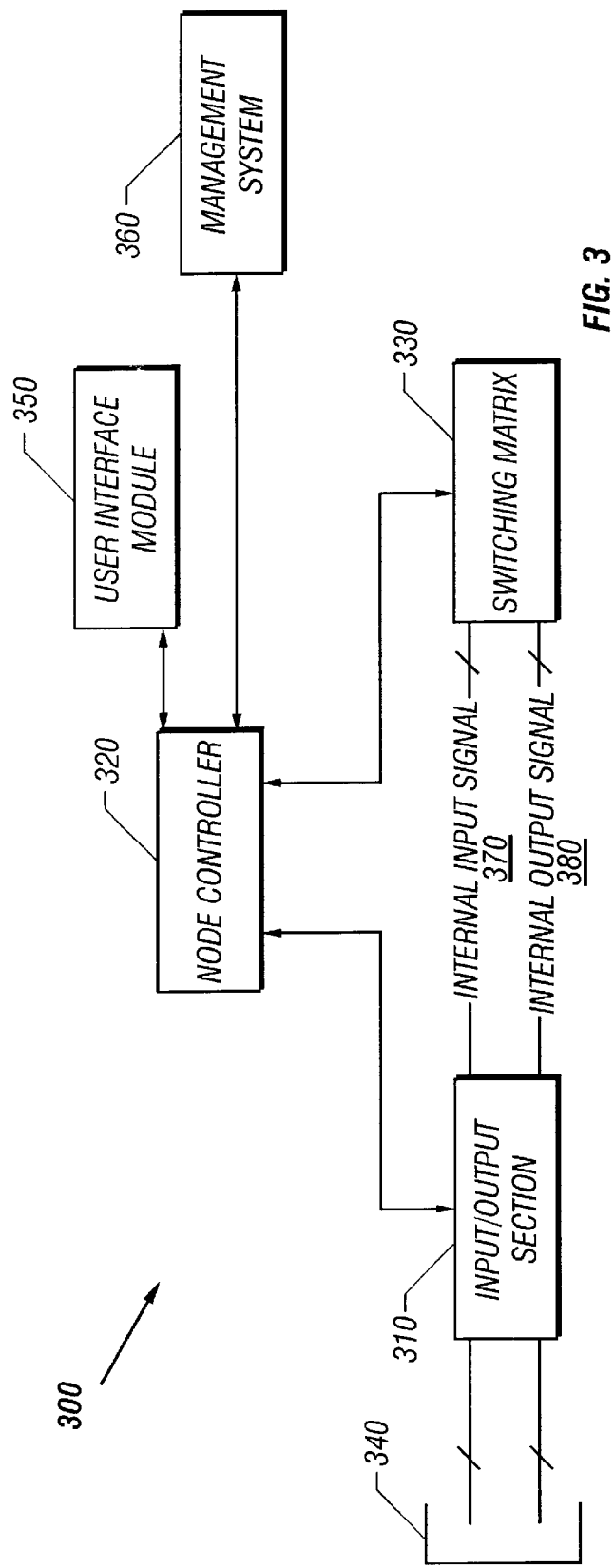

METHOD AND APPARATUS FOR SELECTING A FIRST CLOCK AND SECOND CLOCK FOR FIRST AND SECOND DEVICES RESPECTIVELY FROM AN UP-CONVERTED CLOCK AND AN ALIGNED CLOCK FOR SYNCHRONIZATION

BACKGROUND OF THE INVENTION

1. Field of the Invention

The present invention relates to the field of clock synchronization and more particularly to the flexible synchronization of several clocks of different frequencies across process, voltage and temperature (PVT) variations and other timing differences between devices.

2. Description of the Related Art

A data communications network is the interconnection of two or more communicating entities (i.e., data sources and/or sinks) over one or more data links. A data communications network allows communication between multiple communicating entities over one or more data communications links. High bandwidth applications supported by these networks include streaming video, streaming audio, and large aggregations of voice traffic. In the future, the demands for high bandwidth communications are certain to increase. To meet such demands, an increasingly popular alternative is the use of lightwave communications carried over fiber optic cables. The use of lightwave communications provides several benefits, including high bandwidth, ease of installation, and capacity for future growth.

The synchronous optical network (SONET) protocol is among several protocols designed to employ an optical infrastructure. SONET is widely employed in voice and data communications networks. SONET is a physical transmission vehicle capable of transmission speeds in the multi-gigabit range, and is defined by a set of electrical as well as optical standards. A similar standard to SONET is the Synchronous Digital Hierarchy (SDH) which is the optical fiber standard predominantly used in Europe. There are only minor differences between the two standards. Accordingly, hereinafter any reference to the term SONET refers to both SDH and SONET networks, unless otherwise noted.

SONET utilizes a byte-interleaved multiplexing scheme. Multiplexing enables one physical medium to carry multiple signals. Byte-interleaving simplifies multiplexing and offers end-to-end network management. Each STS is transmitted on a link at regular time intervals (for example, 125 microseconds) and grouped into frames. See Bellcore Generic Requirements document GR-253-CORE (Issue 2 Dec. 1995), hereinafter referred to as "SONET Specification," and incorporated herein by reference for all purposes. The first step in the SONET multiplexing process involves the generation of the lowest level or base signal. In SONET, this base signal is referred to as synchronous transport signal—level 1, or simply STS-1, which operates at 51.84 Mbps (Megabits per second). Data between adjacent nodes is transmitted in these STS modules. Higher-level signals are integer multiples of STS-1, creating the family of STS-N signals in Table 1. An STS-N signal is composed of N byte-interleaved STS-1signals. Table 1 also includes the optical counterpart for each STS-N signal, designated optical carrier level N (OC-N).

TABLE 1

| SIGNAL | BIT RATE (Mbps) |
| --- | --- |
| STS-1, OC-1 | 51.840 |
| STS-3, OC-3 | 155.520 |
| STS-12, OC-12 | 622.080 |
| STS-48, OC-48 | 2,488.320 |
| STS-192, OC-192 | 9,953.280 |

NOTE:
Mbps = Megabits per second
STS = synchronous transport signal
OC = optical carrier SONET organizes STS data streams into frames, consisting of transport overhead and a synchronous payload envelope. The overhead consists of information that allows the network to operate and allow communications between a network controller and nodes. The transport overhead includes framing information and pointers, and performance monitoring, communications, and maintenance information. The synchronous payload envelope is the data to be transported throughout the network, from node to node until the data reaches its destination.

In a system transferring STS-192 data streams at 9.953280 Gbps (Giga bits per second), it is impractical to clock all devices at that high rate. In digital transmission, a clock refers to a series of repetitive pulses that keep the bit rate of data constant and indicate the location of ones and zeroes in a data stream. Instead of clocking all devices at the high data stream rate, data is often transferred between devices at lower data rates, then increased to the higher data rate. For example, a serial bit stream operating at a high data rate can be de-serialized into 16 parallel bits and clocked at $\frac{1}{16}^{th}$ the high data rate and later serialized again running at the higher data rate without changing the amount of data throughput. A framing logic device manipulates the data stream at clock rates ranging from 38.88 MHz to 622.08 MHz. The framing logic device (also referred to as a "framer") transmits a 16-bit parallel data stream to a serializer at 622.08 MHz. The serializer sends the parallel data stream as a bit wide data stream at 9.953280 GHz.

With every increase in SONET data rates, from OC-3 to OC-12 to OC-48 to OC-192, timing problems are introduced between the framer and the serializer. Timing mismatches between devices can occur due to different integrated circuit (IC) technologies. SONET framers tend to be designed in high density, low speed technologies such as CMOS, while SONET serializers tend to be designed in low density, high speed technologies such as Silicon BiPolar or Gallium Arsenide (GaAs). This mismatch in technologies creates disparate data setup and hold times that must be resolved between devices. Furthermore, as SONET data rates increase higher, the amount of timing skew due to process, voltage and temperature variations (PVT) in CMOS processes can exceed a full clock cycle. Additional circuitry is needed to ensure that the transfer of the data stream between the framer and the serializer is kept synchronous.

FIG. 1 illustrates a prior art circuit for synchronizing two clocks using PLL circuitry. A reference clock, labeled CLK A, and an oscillator clock, labeled CLK B, are fed into a phase detector 110 that detects the phase difference between the two clocks. The phase difference output is sent through a low pass filter 120 and an amplifier 130 and controls the frequency of a voltage controlled oscillator (VCO) 140. The phase difference output that is generated by phase detector 110 is used to retune the frequency of VCO 140 whenever CLK B deviates from CLK A. In this way, the frequency of VCO 140 is driven toward the frequency of reference clock CLK A. CLK B tracks the phase of CLK A and locks to CLK A through the feed back loop.

Simply synchronizing two clocks, for example, synchronizing a 622.08 MHz clock which is received by the serializer to a 622.08 MHz clock which is received by the framer, does not take into account any timing differences, such as PVT variations, through the devices. Adding additional circuitry to either the framer or serializer is not desirable due to the low speed technology used for the framer and the low-density technology used for the serializer. A clock synchronizing circuit is needed that is easy to implement on a printed circuit (PC) board, requires no additional support circuitry in either the serializer or the framer, and accounts for PVT variations and other timing differences between the framer and the serializer.

SUMMARY OF THE INVENTION

In accordance with the present invention, a method and apparatus for synchronizing clocks is provided that is flexible and compensates for PVT variations and other timing differences between two devices. The method includes producing an up-converted clock from a system clock, the up-converted clock having a frequency that is a multiple of the frequency of the system clock, producing an aligned clock from a data-aligned clock from a first device and a counter clock from a second device, producing a de-jittered clock, selecting a first reference clock to send to the first device from the up-converted clock, the aligned clock and the de-jittered clock, and selecting a second reference clock to send to the second device from the up-converted clock, the aligned clock and the de-jittered clock.

Another embodiment of the invention is directed to an apparatus which includes a system PLL circuit for producing an up-converted clock from a system clock, the up-converted clock having a frequency that is a multiple of the frequency of the system clock, an alignment PLL circuit for producing an aligned clock from a data-aligned clock from a first device and a counter clock from a second device, a de-jitter PLL circuit for producing a de-jittered clock, a first selection circuit for selecting a first reference clock to send to the first device from the up-converted clock, the aligned clock and the de-jittered clock, and a second selection circuit for selecting a second reference clock to send to the second device from the up-converted clock, the aligned clock and the de-jittered clock.

According to an embodiment, the aligned clock is selected as the first reference clock to send to the first device such that timing differences between the first device and the second device due to PVT variations and set up and hold time differences are reduced.

According to another embodiment, the de-jittered clock is selected as the second reference clock to send to the second device such that timing differences between the first device and the second device due to PVT variations are reduced.

According to another embodiment, the aligned clock is selected as the second reference clock to send to the second device such that timing differences between the first device and the second device due to set and hold time differences are reduced.

In one embodiment the apparatus is a communication circuit disposed in a SONET network.

Another embodiment is directed to a communication system including means for producing an up-converted clock from a system clock, the up-converted clock having a frequency that is a multiple of the frequency of the system clock, means for producing an aligned clock from a data-aligned clock from a first device and a counter clock from a second device, means for producing a de-jittered clock, means for selecting a first reference clock to send to the first device from the up-converted clock, the aligned clock and the de-jittered clock, and means for selecting a second reference clock to send to the second device from the up-converted clock, the aligned clock and the de-jittered clock.

The foregoing is a summary and thus contains, by necessity, simplifications, generalizations and omissions of detail; consequently, those skilled in the art will appreciate that the summary is illustrative only and is not intended to be in any way limiting. As will also be apparent to one of skill in the art, the operations disclosed herein may be implemented in a number of ways, and such changes and modifications may be made without departing from this invention and its broader aspects. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features and advantages made apparent to those skilled in the art by referencing the accompanying drawings. The use of the same reference symbols in different drawings indicates similar or identical items.

FIG. 1 illustrates a prior art circuit for synchronizing two clocks.

FIG. 3 illustrates a clock diagram of an exemplary router.

DETAILED DESCRIPTION

The following is intended to provide a detailed description of an example of the invention and should not be taken to be limiting of the invention itself. Rather, any number of variations may fall within the scope of the invention that is defined in the claims following the description.

Figure 2:
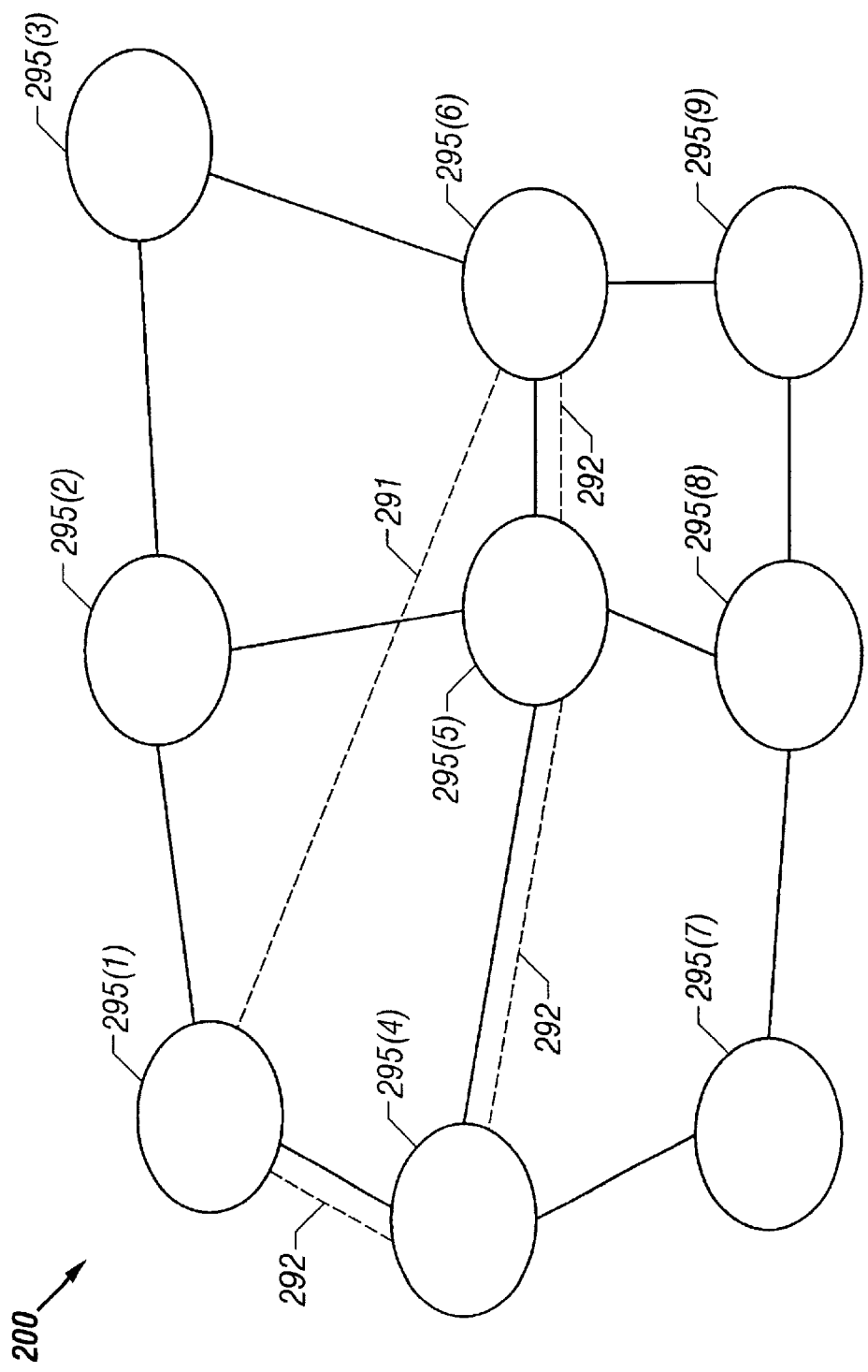
FIG. 2 illustrates a network environment in which embodiments of the present invention may be practiced.

FIG. 2 illustrates a network environment in which embodiments of the present invention may be practiced. Network 200 includes a number of nodes, network nodes 295 (1)–(N). One or more of network nodes 295(1)–(N) can be a router such as router 300, described in FIG. 3, or any other type of telecommunication hub such as a repeater. Network 200 can support the automatic provisioning, testing, restoration, and termination of virtual paths (exemplified by a virtual path 291) over a physical path (exemplified by a physical path 292) from one of network nodes 295(1)–(N) to another of network nodes 295(1)–(N). Physical path 292 may utilize fiber-optic cables, for example. While copper cabling may also be employed, such an option may not offer the speed and number of connections provided by an optical arrangement.

FIG. 3 illustrates a block diagram of an exemplary router 300. Router 300 is a high-capacity telecommunication network device based on optical technologies and components that provides routing, grooming and restoration at wavelength levels as well as wavelength-based services. Router 300 interconnects routers and switches across an optical transport network, accepting various wavelengths on input ports and routing them to appropriate output ports in the network. Router 300 provides routing for traffic at wavelength granularities, e.g., OC-48 or OC-192, and enables functionality to be controlled by software managed centrally.

Router 300 includes an input/output section 310, a node controller 320, and a switching matrix 330. Node controller 320 contains, for example, real time software and intelligent routing protocols (not shown). Router 300 supports interfaces including, but not limited to, optical signal interfaces 340 (e.g., SONET), a user interface module 350, and a management system 360. Internal input signals 370 and internal output signals 380 may be electrical or optical in nature. Router 300 preferably provides redundancy at all levels to prevent any single point system failure. All processors, memory and communications are preferably 1:1 redundant.

Shelf or node controller 320 is responsible for managing and controlling input/output section 310, which can contain multiple line cards. Some of the functions handled by node controller 320 include the periodic collection of maintenance data from the line cards, receiving and processing periodic keep-alive messages from those cards, shelf startup and configuration, proxy management, and other related functions. Each line card is coupled to two fiber optic cables, one for each direction. The fiber optic cables support a standard OC-48 or OC-192 SONET data stream. Switching matrix 330 provides routing and switching between line cards.

In one embodiment, router 300 can be used, for example, as SONET line terminating equipment (LTE) capable of terminating the Section and Line overheads of received OC-48 and OC-192 signals, and cross-connecting those signals according to provisioned input-output mappings. Some of the terminated signals can optionally be protected using any of the common protection schemes (1+1, 1:1, and 1:N). Overhead processing and generation is performed on the line card by a protocol processor. This protocol processor handles all aspects of the SONET protocol, including framing, insertion and extraction of embedded data channels, error checking, AIS detection, pointer processing, clock recovery, multiplexing/duplexing, and similar duties.

Figure 4:
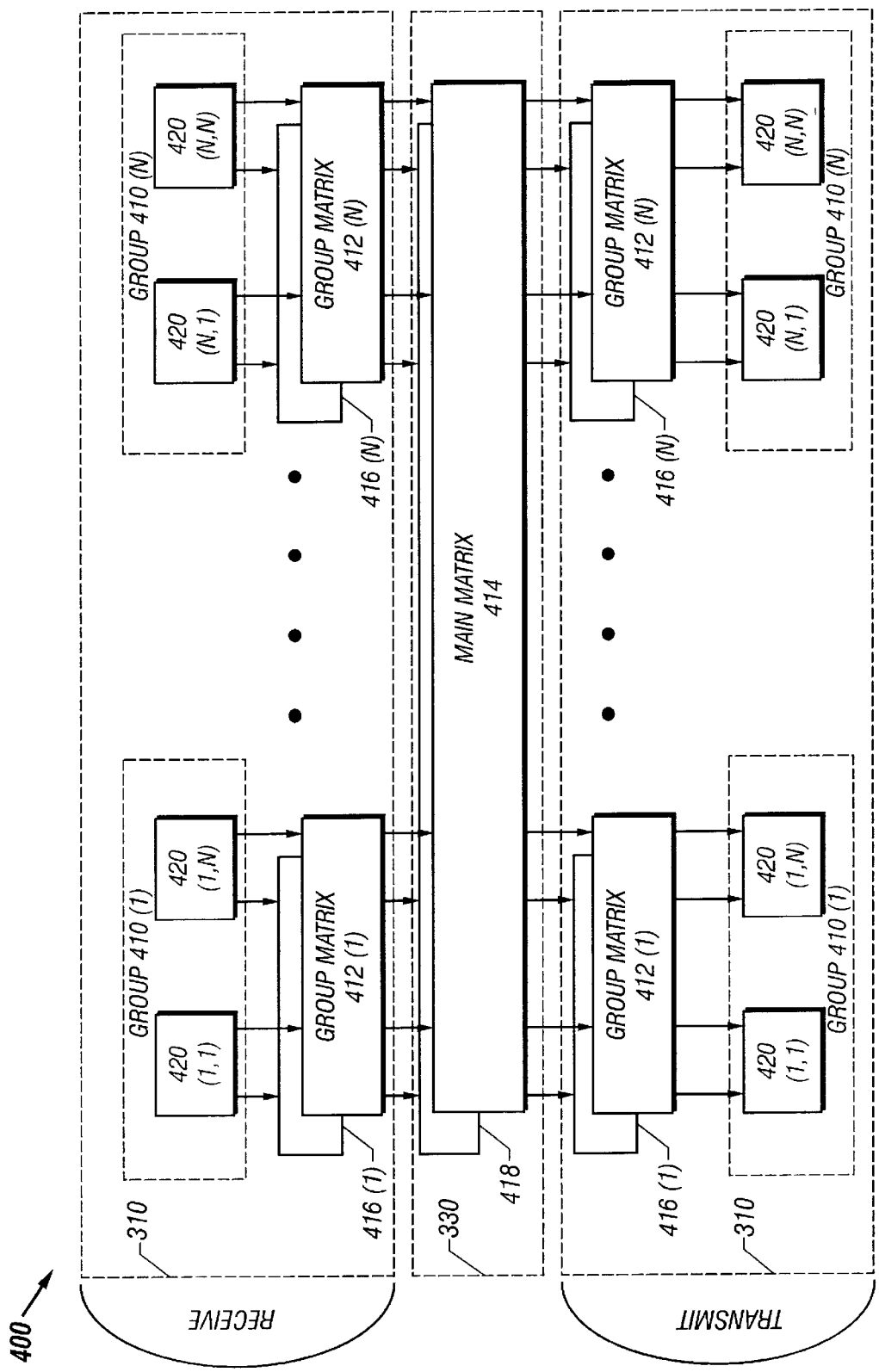
FIG. 4 illustrates a block diagram of the signal paths and functional blocks of an exemplary router.

FIG. 4 is a block diagram of signal paths 400 within router 300. The primary signal paths in router 300 include one or more groups exemplified by groups 410(1)–(N), group matrices 412(1)–(N), and a main matrix 414. Groups 410 (1)–(N) and group matrices 412(1)–(N) are shown as having receive and transmit sections. Groups 410(1)–(N) each include line cards 420(1, 1)–(1,N), through line cards 420(N, 1)–(N, N). Signals from line cards 420(1,1)–(N,N) are sent to the corresponding group matrix. In one embodiment, two sets of the group matrix cards, depicted in FIG. 4 as group matrices 412(1)–(N) and 416(1)–(N), are employed. In one embodiment, main matrix 414 is also mirrored by a redundant copy (a backup main matrix 418). Main matrix 414 and backup main matrix 418 together form switching matrix 330. As shown in FIG. 4, redundancy for group matrices 412(1)–(N) (i.e., group matrices 416(1)–(N)) exists on the transmit side.

It will be noted that the variable identifier "N" is used in several instances in FIG. 4 and other figures (and subsequent use of other variables, such as "m," "x," "k," and others) to more simply designate the final element (e.g., group matrix 412(N), line card 420(N,N), and so on) of a series of related or similar elements (e.g., group matrices 412(1)–(N), line cards 420(1,1)–(N,N), and so on). The repeated use of such variable identifiers is not meant to imply a correlation between the sizes of such series of elements. The use of such variable identifiers does not require that each series of elements have the same number of elements as another series delimited by the same variable identifier. Rather, in each instance of use, the variable identified by "N" (or "m," "x," "k," and others) may hold the same or a different value than other instances of the same variable identifier. For example, group matrix 412(N) may be the tenth group matrix in a series of group matrices, whereas line card 420(N,N) may be the forty-eighth line card in a series of line cards.

Using signal paths 400 as an example, data enters the system at one of line cards 420(1,1)–(N,N). It is at this point, in a SONET-based system, that the Section and Line overheads are processed and stripped off by a protocol processor (not shown). The extracted SONET payload envelope is then synchronized with the system clock and sent to two different copies of a local matrix, depicted as group matrices 412(1) –(N) and 416(1)–(N). In one embodiment, group matrices 412(1)–(N) and 416(1)–(N) are used mainly as 2:1 reduction stages that select one of two optical signals and pass the selected optical signal to switching matrix 330. This allows the implementation of a variety of protection schemes (including 1:N, or 0:1) without having to use any additional ports on main matrix 414. All protect signals are terminated at group matrices 412(1)–(N) and 416(1)–(N). In order to maximize bandwidth, it is preferable that only active signals be passed through to switching matrix 330.

In one embodiment, switching matrix 330 is an errorless, rearrangeably nonblocking switching network. In one embodiment, switching matrix 330 is a 256×256 switching network that consists of three columns and 16 rows of 16×16 switching elements that allow any of their inputs to be connected to any of their outputs. A single copy of the matrix may be housed, for example, in a single rack that contains three shelves, one for each column (or stage) of the matrix. Each one of such shelves contains cards housing the 16 switching elements in each stage. The switching element itself includes, for example, a 16×16 cross-point switch, with optical transceivers, and a microcontroller for controlling the cross-point switch and providing operational feedback to the level-2 processor. Communications between the two processors may be carried, for example, over an Ethernet connection. The level-2 processor in turn communicates with the level-1 and route processors.

Line cards 420(1,1)–(N,N) receive optical signals from group matrices 412(1)–(N) and 416 (1)–(N) which are in turn connected to two separate copies of the main matrix. Line cards 420(1,1)–(N,N) monitor both signals for errors and, after a user-defined integration period, switch to the backup signal if that signal exhibits better signal quality, (e.g., lower bit error rate (BER)) than the prior active signal. This scheme, referred to herein as 1-plus-1, allows line cards 420(1,1)–(N,N) to select between the two copies of the group matrix without any level-1 or level-2 CPU intervention. This helps to ensure that such a switch can be made in 50 ms or less (per Bellcore's recommendations in the SONET Specification). The selected signal is then processed by the transmit section of the protocol processor, which inserts all required transport overhead bytes into the outgoing stream.

Regarding the signals described herein, both above and subsequently, those skilled in the art will recognize that a signal may be directly transmitted from a first logic block to a second logic block, or a signal may be modified (e.g., amplified, attenuated, delayed, latched, buffered, inverted, filtered or otherwise converted, etc.) between the logic blocks. Although the signals of the embodiments described herein are characterized as transmitted from one block to the next, other embodiments may include modified signals in place of such directly transmitted signals with the informational and/or functional aspect of the signal being transmitted between blocks. To some extent, a signal input at a second logic block may be conceptualized as a second signal derived from a first signal output from a first logic block due to physical limitations of the circuitry involved (e.g., there will inevitably be some attenuation and delay). Therefore, as used herein, a second signal derived from a first signal includes the first signal or any modifications to the first signal, whether due to circuit limitations or due to passage through other circuit elements which do not substantively change the informational and/or final functional aspect of the first signal.

Figure 5:
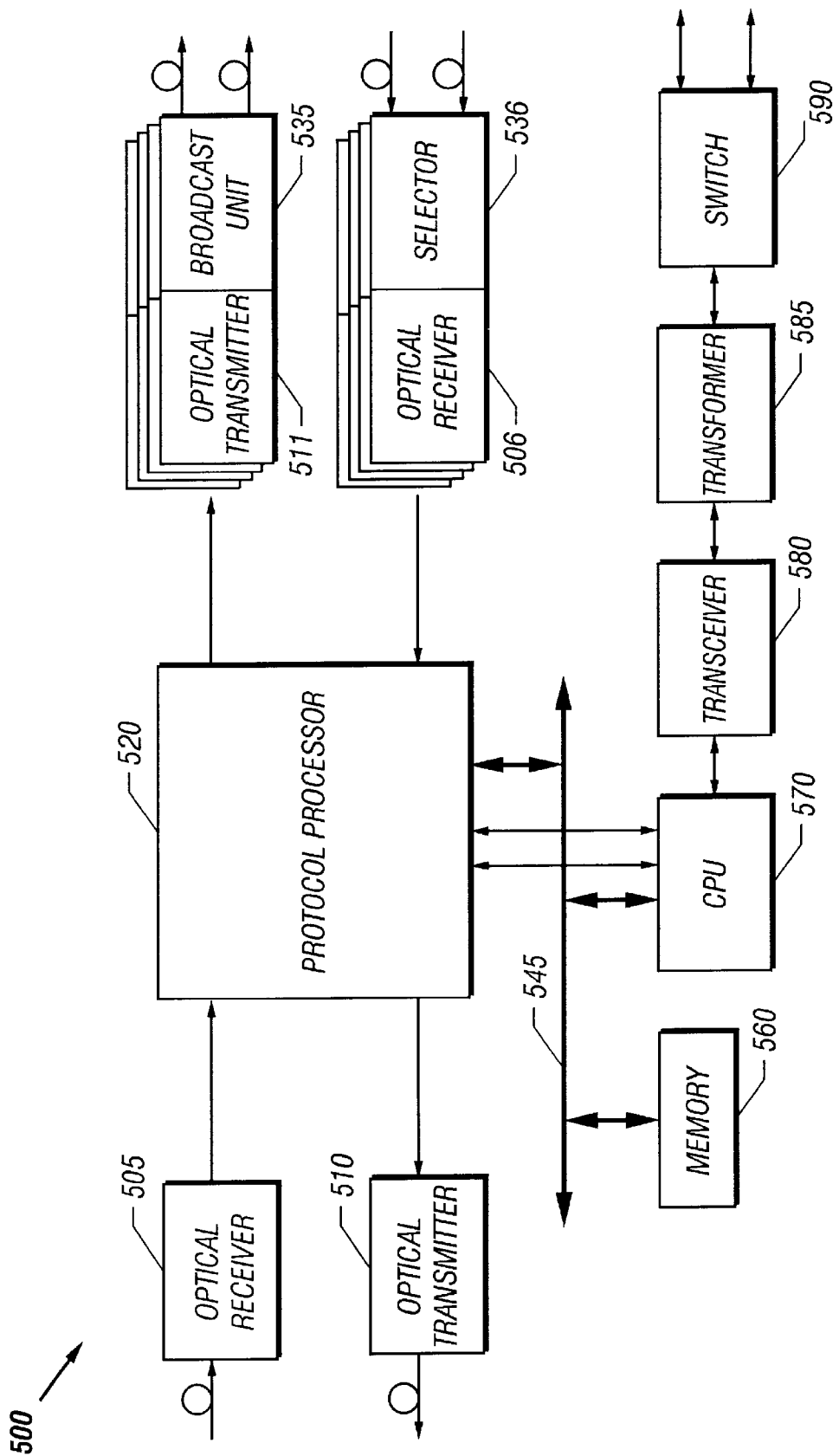
FIG. 5 illustrates the major components of an exemplary line card.

FIG. 5 illustrates the major components of one of line cards 420(1,1)–(N,N), exemplified in FIG. 5 by a line card 500. Line card 500 integrates all necessary hardware and software functions to properly terminate the physical layer. Line card 500 also provides a redundant optical connection to the switch matrix, and a communication channel to other modules in the system.

Line card 500 performs all aspects of the SONET protocol, including framing, insertion and extraction of embedded data channels, error checking, pointer processing, clock recovery, and multiplexing/duplexing. Data enters the system at line card 500 via an OC-48 or OC-192 optical channel. In a SONET implementation, line card 500 terminates the transport overhead (Section+Line) of a SONET data stream, (e.g., a full duplex OC-48 or OC-192 data stream). The extracted SONET payload envelope is then synchronized with a system clock and sent to switching matrix 330. Data leaving the system is processed by the transmit section of the line card, which inserts all required transport overhead bytes into the outgoing stream.

Line card 500 receives optical signals from other network elements via a line side optical receiver 505 and from the local router's system via a system-side optical receiver 506. Each of these receivers implements an optical-to-electrical (O/E) conversion function. Line card 500 transmits optical signals to other network elements using a line-side optical transmitter 510 and to the group matrices using a system-side optical transmitter 511. Each of these transmitters implements an electrical-to-optical (E/O) conversion function. Optical transmitter 511 can transmit an OC-48 data stream or multiples of lower bandwidth data streams (e.g., 4 OC-12 data streams or 48 OC-1 data streams). Optical receiver 506 can receive an OC-48 data stream or multiples of lower bandwidth data streams. Optical transmitter 511 and optical receiver 506 can be duplicated to handle higher bandwidth data streams. For example, four optical transmitters 511 together can transmit an OC-192 data stream and four optical receivers 506 together can receive an OC-192 data stream. It will be noted that line-side refers to the side of the line card coupled to other network elements and system-side refers to the side of the line card coupled to the group matrices.

Line-side optical receiver 505 is coupled to a protocol processor 520 that performs clock recovery multiplexing, de-multiplexing, and SONET STE/LTE (Section Terminating Equipment/ Line Terminating Equipment) processing in both directions. Similarly, system-side optical receiver 506 is also coupled to protocol processor 520 to allow protocol processor 520 to receive optical signals. The processed electrical signals from protocol processor 520 are coupled to the transmitters 510 and 511. The clock recovery functions are preferably combined with de-multiplexers and multiplexers to support reception and transmission of the optical data, respectively. The multiplexers serialize output data generated in protocol processor 520 by performing parallel-to-serial conversion on the parallel data. In contrast, de-multiplexers are used in protocol processor 520 to perform serial-to-parallel conversion on received data.

In order to add protection channels, line-side optical transmitter 510 is also coupled to a 1:2 broadcast unit 535. To receive such optical signals, optical receiver 506 is also coupled to a 2:1 selector 536 in order to select the working channel before the optical signals leave the shelf and thus prevent the standby channel (also referred to herein as the protect channel) from using any bandwidth on switching matrix 330.

Protocol processor 520 is coupled to a bus 545. Protocol processor 520 interfaces the line card to two copies of the matrix in a 1+1 physical protocol. In a SONET implementation, protocol processor 520 provides both STE/LTE processing according to published industry standards. Also coupled to bus 545 are a memory 560 and a CPU 570. Memory 560 should be fast enough for efficient operation of CPU 570.

CPU 570 communicates with other line cards 420(1,1)–(N,N) over a control bus (not shown) using a transceiver 580 that is coupled to CPU 570. Transceiver 580, is coupled to a transformer 585 which is coupled to a switch 590. Switch 590 is coupled to the control bus. Switch 590 implements a 1:1 protection scheme for transceiver 580 and couples CPU 570 to two independent ports on the backplane (not shown). Each of the two ports connects to one copy of the hub of the group matrix. This allows the software on the line card to switch to the backup link when the software detects failures on the active link.

Preferably, CPU 570 includes numerous integrated peripherals including embedded SCC channels (e.g., in-band communications, not shown) and an Ethernet controller (for example, to support communications with other system modules, not shown). In one embodiment, CPU 470 provides an on board communications processor module (not shown) that handles time-critical aspects of the protocols supported.

Figure 6:
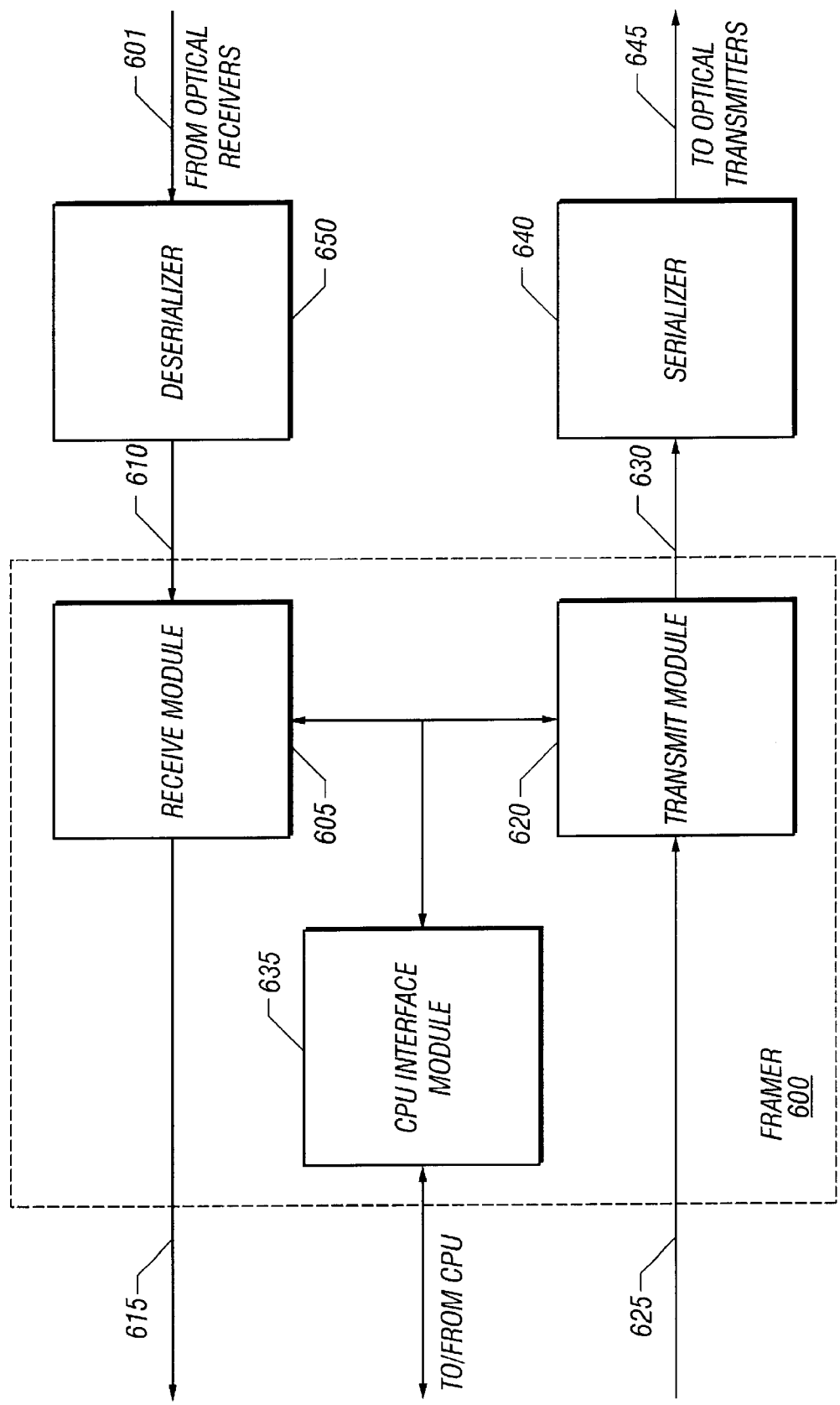
FIG. 6 illustrates portions of an exemplary protocol processor.

FIG. 6 illustrates a block diagram of portions of protocol processor 520 that includes a framer 600. Deserializer 650 produces a parallel signal 610 from an incoming SONET signal 601 (e.g., an OC-192 data stream) from line side optical receivers (not shown). Receive module 605 processes the parallel signal 610, optionally processes the forward error correction (FEC) information and de-interleaves the OC-192 signal into four OC-48 line rate signals 615 for delivery to downstream OC-48 processors. Transmit module 620 processes four incoming OC-48 system rate signals from the OC-48 processors (signals 625), optionally inserts forward error correction information, and interleaves the four OC-48 signals into an OC-192 signal 630 for transmission by line side optical transmitters (not shown). A CPU Interface module 635 provides the CPU connection to the internal device registers.

OC-192 signal 630 from transmit module 620 can be a 16 bit wide signal at 622.080 MHz (Mega Hertz). Serializer 640 receives and serializes OC-192 signal 630 into a bit wide signal at 9.953280 GHz (Giga Hertz). Framer 600 including receive module 605, transmit module 620 and CPU interface module 635, can be implemented in an ASIC (application specific integrated circuit) using CMOS technology. Due to the high switching speed required of serializer 640, GaAs or BiCMOS technology is typically employed.

Framer 600 has an input reference clock (not shown) having a frequency of 622.080 MHz. Framer 600 internally generates two output data-aligned clocks (not shown) having frequencies of 622.080 MHz and 155.520 MHz derived from the input reference clock. The data-aligned clocks are aligned to OC-192 signal 630. The data-aligned clocks are offset from the input reference clock due to PVT variations and other timing differences through framer 600. Serializer 640 has selectable input reference clock (not shown) having a frequency of either 622.080 MHz or 155.520 MHz. Serializer 640 internally generates an output counter clock (not shown) having a frequency of 622.080 MHz derived from the selectable input reference clock. The counter clock is aligned to the serial data stream 645 output from serializer 640. The counter clock is offset from the selectable input reference clock due to PVT and other timing differences through serializer 640. Synchronization circuitry is needed to ensure that the high-speed data transfer of OC-192 signal 630 from framer 600 to serializer 640 occurs without error.

There are two methods traditionally used to compensate for the timing mismatch between two devices: forward clocking and counter clocking. In forward clocking, a data-aligned clock (forward clock) is sent with the data from a first device to a second device. The data-aligned clock is aligned to the data and includes any PVT and other timing variation through the first device. The second device typically contains additional circuitry to synchronize the forward clock with the second device's own reference clock. The reference clock of the second device is brought into alignment with the forward clock from the first device. There are many different techniques of implementing this additional circuitry inside the second device. The support for forward clocking can be easily implemented on a PC board since the circuitry is implemented inside the second device. However, the additional circuitry is complex and requires many gates. If the second device is fabricated in a high speed, low-density process, it is possible that there is not sufficient room or power available for the additional gates to support forward clocking.

In counter clocking, the second device sends a clock (counter clock) back to the first device, and additional circuitry is located inside the first device or on the PC board to align the counter clock with the first device's reference clock and keep the devices synchronized over PVT variations. The counter clock is synchronized to the second device's data output and takes into account any PVT and data set up and hold time adjustments. The advantage of counter clocking is that no additional circuitry is required in the second device, which may be built in a high-speed low-density process. However, the circuitry required to align the counter clock from the second device with the reference clock of the first device can be difficult to implement on a PC board or inside the first device if the first device is built in a slow process. A common practice in counter clocking is to use a Delay-Lock-Loop (DLL) or a Phase-Lock-Loop (PLL) to keep the two devices synchronized.

Figure 7:
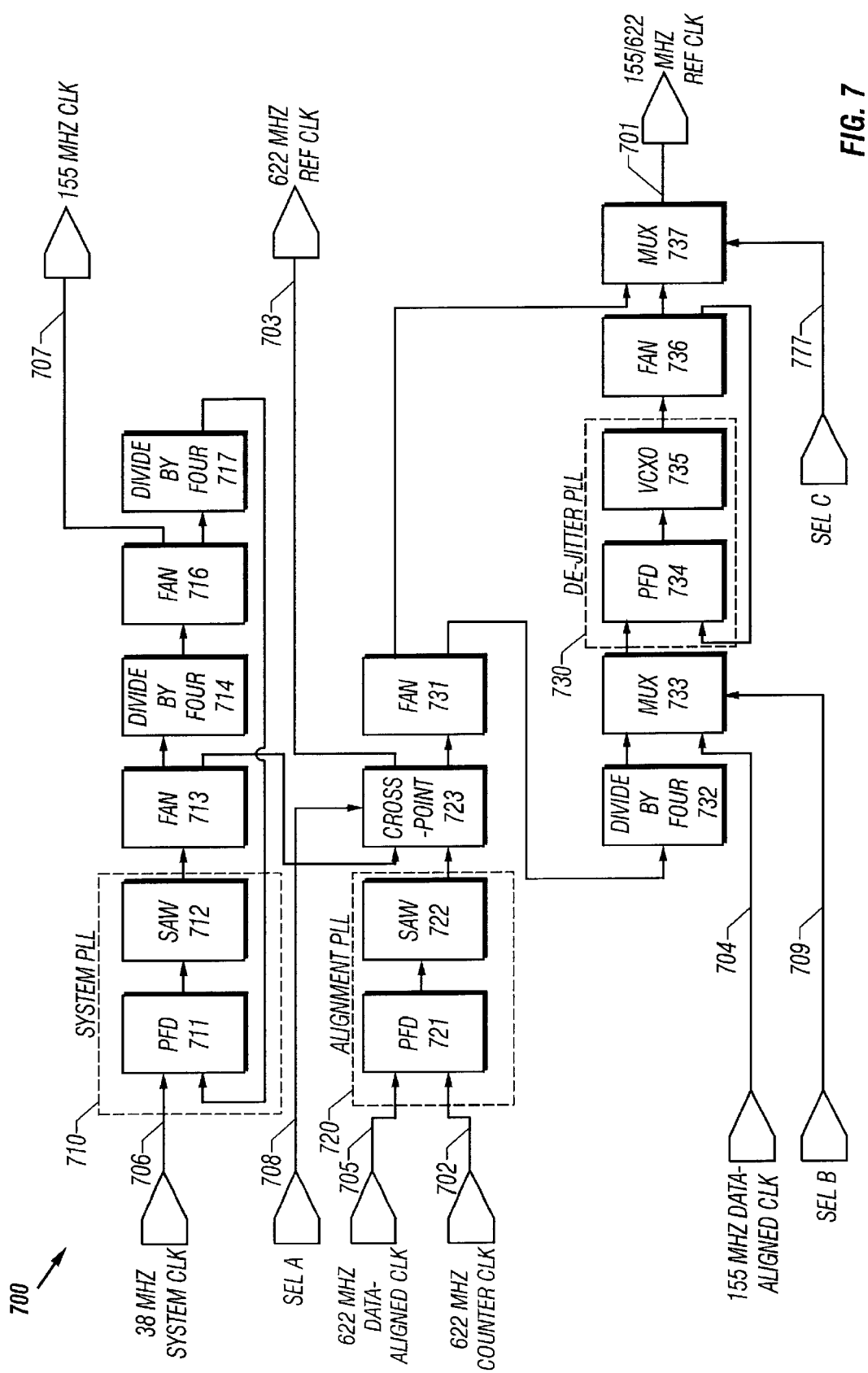
FIG. 7 illustrates a synchronization and timing circuitry according to the present invention.

FIG. 7 illustrates a timing and synchronization circuit, circuit 700, according to the present invention. Circuit 700 does not require additional circuitry in framer 600 or serializer 640 and supports both forward and counter clocking. Circuit 700 supports several different clock modes that may be selected at any time. Adjustments to reference clocks are made accounting for clock skew due to PVT and other timing variations between framer 600 and serializer 640 by utilizing the data-aligned clocks from framer 600 and the counter clock from serializer 640. As explained above, the data-aligned clocks from framer 600 and the counter clock from serializer 640 include PVT and other timing variations associated with framer 600 and serializer 640.

Circuit 700 is designed to interface an OC-192 SONET framer such as framer 600 with a 16-to-1 serializer, such as serializer 640. (Hereinafter, all clock frequencies will be abbreviated. For brevity, 9.953280 GHz, 622.080 MHz, 155.520 MHz, and 38.880 MHz are referred to as 10 GHz, 622 MHz, 155 MHz, and 38 MHz respectively). Serializer 640 can accept a 155 MHz or 622 MHz selectable reference clock (signal 701), receive a 16-bit wide data path at 622 MHz (not shown in FIG. 7), and output a 622 MHz counter clock (signal 702). Framer 600 receives a 622 MHz reference clock input (signal 703), and outputs both a 155 MHz data-aligned clock (signal 704) and a 622 MHz data-aligned clock (signal 705). The inputs to circuit 700 include a 38 MHz system clock (signal 706) from a system clock source, 155 MHz data-aligned clock (signal 704) and 622 MHz data-aligned clock (signal 705) from framer 600, and a 622 MHz counter clock (signal 702) from serializer 640. The outputs of circuit 700 include a 622 MHz reference clock (signal 703) for framer 600 and a selectable 155 MHz or 622 MHz reference clock (signal 701) for serializer 640. A 155 MHz reference clock (signal 707) is also produced and available for future use. Select signals, SELA (signal 708), SELB (signal 709), and SELC (signal 777), are used to select the various clocking modes of circuit 700.

Referring to FIG. 7, signal 706 is received by a phase frequency detector (PFD) 711. A surface acoustic wave device (SAW) 712 receives the output of PFD 711. Together, PFD 711 and SAW 712 up-convert the 38 MHz system clock (signal 706) to 622 MHz. SAW 712 is a surface acoustic wave based voltage controlled oscillator (VCO) that operates in a manner similar to a voltage controlled crystal oscillator. SAW 712 is used due to its ability to generate very high frequency output clocks.

The output of SAW 712 is received by a fanout 713. Fanout 713 is circuitry that buffers and duplicates a high-speed signal, allowing the signal to drive two or more different devices while maintaining signal integrity. A divide-by-four circuit 714 receives a first output of fanout 713. Divide-by-four circuit 714 reduces the frequency of the input signal by a factor of four. The output of divide-by-four circuit 714 is received by a fanout 716. A first output of fanout 716 is a 155 MHz reference clock (signal 707) that is available for future use. A second output of fanout 716 is received by a divide-by-four 717. Output of divide-by-four 717 is fed back as a second input received by PFD 711. The combination of divide-by-four 714 and divide-by-four 717 creates a 38 MHz signal that is used to close the up-converter loop. Fanout 713 and fanout 716 are used to create a 622 MHz clock and a 155 MHz clock utilized by circuit 700. System PLL 710, including PFD 711 and SAW 712, is used to create reference clocks derived from signal 706.

A 622 MHz data-aligned clock (signal 705) is received by a PFD 721. A 622 MHz counter clock (signal 702) is also received by PFD 721. The output of PFD 721 is received by a SAW 722. The output of SAW 722 is received by a two-by-two (2×2) cross-point 723. 2×2cross-point 723 also receives a second output of fanout 713. 2×2Cross-point 723 switches signals from two inputs to two outputs and can switch any input to any output, under control of a select signal SELA (signal 708). A first output of 2×2cross-point 723 becomes a 622 MHz reference clock, signal 703, which is sent to framer 600. Alignment PLL 720, including PFD 721 and SAW 722, creates reference clocks for framer 600 and serializer 640 that are aligned across PVT variations and other timing differences by aligning data-aligned clock signal 705 to counter clock signal 702. Because data-aligned clock signal 705 includes PVT variations and other timing delays through framer 600, and because counter clock signal 702 includes PVT variations and other timing delays through serializer 640, the resulting reference clocks from alignment PLL 720 are adjusted for these timing variations.

A second output of 2×2cross point 723 is received by fanout 731. A first output of fanout 731 is received by a divide-by-four 732. The output of divide-by-four 732 is received by a multiplexer 733. A 155 MHz data-aligned clock (signal 704) is received as a second input of multiplexer 733. Multiplexer 733 selects between the two inputs, under control of a select signal SELB (signal 709). The output of multiplexer 733 is received by a PFD 734. The output of PFD 734 is received by a voltage controlled crystal oscillator (VCXO) 735. VCXO 735 has a high Q for jitter attenuation. Jitter is the dynamic displacement of digital signals from their long term average positions, measured in degrees rms. Jitter on a clock signal causes jitter on the retimed data. System timing clocks, such as the 38 MHz system clock, are typically generated by CMOS circuitry and tend to exhibit significant jitter. The output of VCXO 735 is received by a fanout 736. A first output of fanout 736 is fed back to PFD 734. A multiplexer 737 receives a second output of fanout 736. Multiplexer 737 also receives a second output of fanout 731. The output of multiplexer 737 is a selectable 155 MHz or 622 MHZ reference clock (signal 701), selectable under the control of select signal SELC (signal 777). De-jitter PLL 730, including PFD 734 and VCXO 735, creates a de-jittered 155 MHz clock signal.

The selection of cross-point 723, multiplexer 733 and multiplexer 737 creates flexibility to define the desired method of clock timing and synchronization. During system test, different clock modes can be tested and compared to determine the method that provides optimum performance. Because circuit 700 incorporates flexibility to choose a particular method of clock timing and synchronization and is implemented on a PC board, framer 600 and serializer 640 can be implemented without additional circuitry and can avoid re-fabrication as a result of changing clock synchronization needs.

Figure 8A:
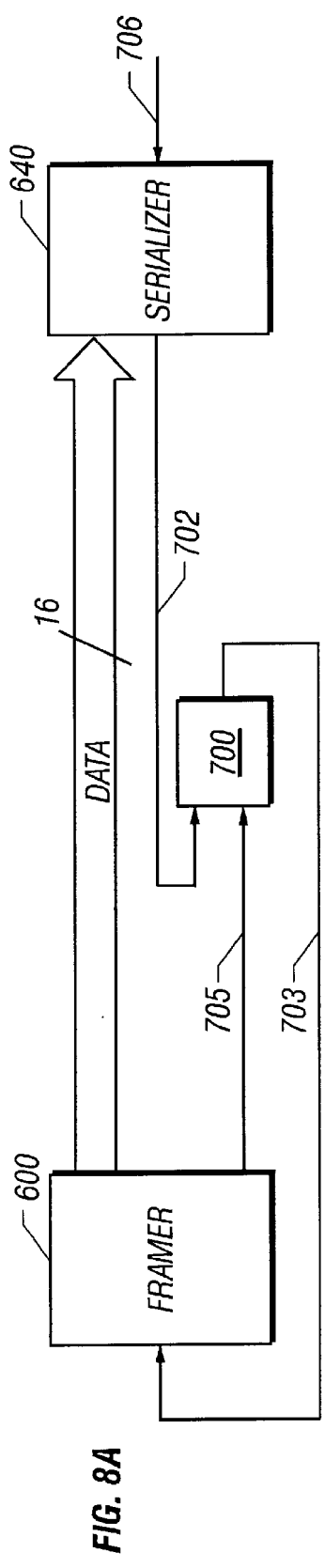
FIGS. 8A–8C illustrate alternate implementations of the timing and synchronization circuitry according to the present invention.
Figure 8B:
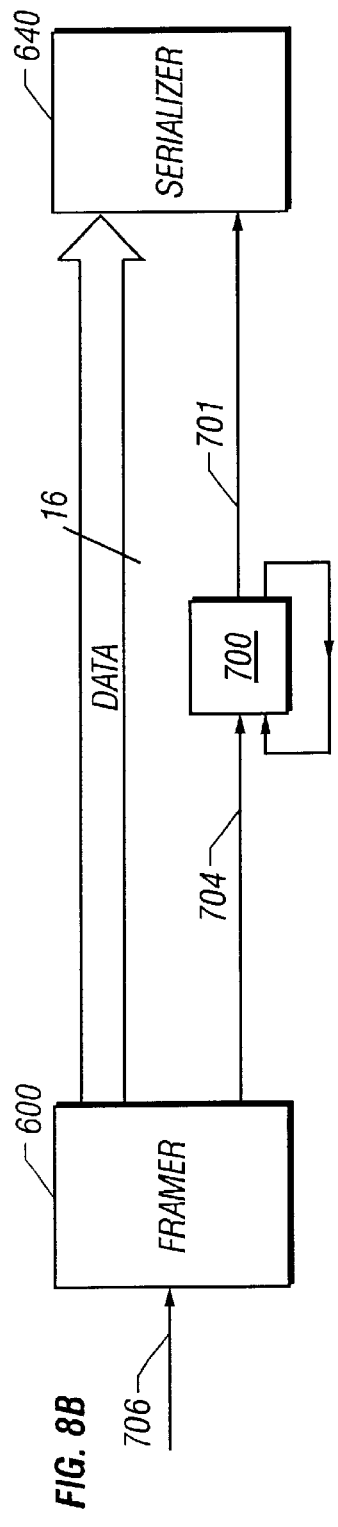
Figure 8C:
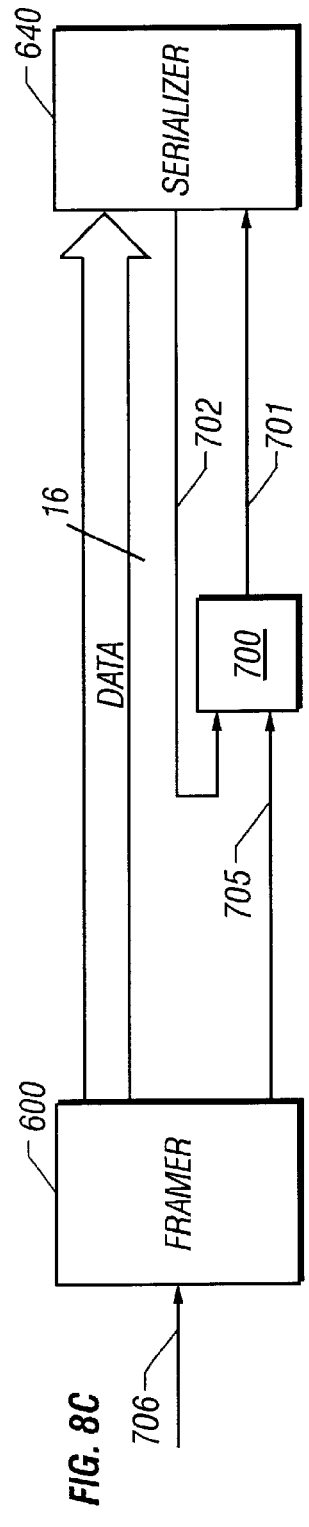

FIGS. 8A–8C illustrate three alternate implementations of timing and synchronization circuit 700 according to the present invention. Each of FIGS. 8A–8C illustrate a different functionality determined by select signals, SELA (signal 708), SELB (signal 709) and SELC (signal 777), to create the desired clock synchronization implementation. Although not all signals are shown in FIGS. 8A–8C, the clocks are connected as described in FIG. 7. The clock signals shown in FIGS. 8A–8C illustrate each particular method of synchronization and generation of reference clocks that takes into account PVT and other timing variations between framer 600 and serializer 640. Each of the illustrated modes generates the reference clocks differently, allowing the system designer to choose the implementation providing optimal system performance.

FIG. 8A is a block diagram illustrating a first clock synchronization implementation of circuit 700. A 622 MHz data-aligned clock (signal 705) from framer 600 and a 622 MHz counter clock (signal 702) from serializer 640 are synchronized to generate a 622 MHz reference clock (signal 703) for framer 600. Referring to FIG. 7, with regard to the configuration of the clock synchronization method of FIG. 8A, 2×2cross-point 723 is crossed and so sends the second output of fanout 713 to fanout 731 and the output of SAW 722 to the 622 MHz reference clock (signal 703) sent to framer 600. Signal 703 is the result of the synchronization of the 622 MHz data-aligned clock (signal 705) and the 622 MHz counter clock (signal 702) generated by alignment PLL 720. SEL B (signal 709) is set so that multiplexer 733 selects the output of divide-by-four 732, a 155 MHz clock generated by system PLL 710 from the 38 MHz system clock. SEL C (signal 777) may be set to select either of its inputs to select a 155 MHz or a 622 MHz clock to generate the 155 MHz/622 MHz reference clock (signal 701). The setting of SEL C (signal 777) changes according to the frequency required by serializer 640. Serializer 640 can be a device that requires a 155 MHz reference clock or a device that requires a 622 MHz reference clock. Multiplexer 737 selects either a 622 MHz clock generated by system PLL 710 or a 155 MHz clock generated by the combination of system PLL 710, divide-by-four 732 and de-jitter PLL 730.

A 155 MHz or 622 MHz reference clock (signal 701) for serializer 640 is derived from the 38 MHz system clock, selecting either a 622 MHz clock or a de-jittered 155 MHz clock. Serializer 640 operates synchronized to the 38 MHz system clock (signal 706). The 622 MHz reference clock (signal 703) for framer 600 is created from the alignment of the 622 MHz data-aligned clock (signal 705) from framer 600 and the 622 MHz counter clock (signal 702) from serializer 640. Framer 600 operates synchronized to the PVT and other timing delayed clocks (signal 702 and signal 705) from serializer 640 and from framer 600. Signal 703 accounts for any PVT through framer 600 and any data delay, set up and hold timing differences through serializer 640. The implementation of FIG. 8A is similar to a counter clocking technique where the counter clock from the second device is synchronized with the reference clock from the first device. However this implementation synchronizes the counter clock from the second device with the data-aligned clock from the first device generating the reference clock for the first device. This corrects for both PVT variations and other timing differences.

FIG. 8B is a block diagram illustrating a second clock synchronization implementation of circuit 700. Serializer 640 receives a 155 MHz/622 MHz reference clock (signal 701) from circuit 700 generated from a 155 MHz data-aligned clock (signal 704). Referring to FIG. 7, with regard to the configuration of FIG. 8B, 2×2cross-point 723 is not crossed, connecting signal 703 to the 622 MHz clock generated by system up-convert PLL 710 from the 38 MHz system clock (signal 706). Multiplexer 733 selects the 155 MHz data-aligned clock (signal 704). The output of multiplexer 733 is de-jittered by de-jitter PLL 730, selected by multiplexer 737, and becomes a 155 MHz reference clock (signal 701) to serializer 640.

A 622 MHz reference clock (signal 703) for framer 600 is generated by up-converting the 38 MHz system clock (signal 706). Framer 600 operates synchronized to the system clock. A 155 MHz reference clock (signal 701) for serializer 640 is derived from a de-jittered 155 MHz data-aligned clock (signal 704) from framer 600. Signal 701 is aligned to account for any PVT though framer 600. The implementation of FIG. 8B is similar to a feed forward clocking technique where the data-aligned clock from the first device is synchronized with the reference clock of the second device. Here, the data-aligned clock is de-jittered and becomes the reference clock of the second device, correcting for PVT and other timing variations through the first device.

FIG. 8C is a block diagram illustrating a third clock synchronization implementation of circuit 700. A 622 MHz data-aligned clock (signal 705) and a 622 MHz counter clock (signal 702) are synchronized to generate a 622 MHz reference clock which may also be divided-by-four and de-jittered to generate a de-jittered 155 MHz reference clock. Either the generated 622 MHz reference clock or the de-jittered 155 MHz reference clock is selected to generate signal 701, a 155 MHz or 622 MHz reference clock for serializer 640. Referring to FIG. 7, with regard to the configuration of the clock synchronization method of FIG. 8C, 2×2cross-point 723 is not crossed, and so connects signal 703 to the 622 MHz clock generated by system up-convert PLL 710 derived from the 38 MHz system clock. In addition, 2×2cross-point 723 sends the result of alignment PLL 720 to fanout 731. The second output of fanout 731 is sent to divide-by-four 732. Multiplexer 733 selects the output of divide-by-four 732 and sends the signal to de-jitter PLL 730. SEL C, signal 777, may be set to select either of its inputs to generate a 155 MHz de-jittered or a 622 MHz reference clock (signal 701). The setting of SEL C changes according to the desired frequency of the reference clock for serializer 640.

A 622 MHz reference clock (signal 703) for framer 600 is generated by up-converting the 38 MHz system clock (signal 706). Framer 600 operates synchronized to the 38 MHz system clock. A reference clock for serializer 640 is derived from either a aligned 622 MHz clock created from the alignment of a 622 MHz data-aligned clock from framer 600 and a 622 MHz counter clock from serializer 640, or a divided and de-jittered 155 MHz clock derived from the same aligned 622 MHz clock. The reference clock of serializer 640 has been aligned to account for any PVT and any other timing variations through framer 600 and through serializer 640. The implementation of FIG. 8C combines the benefits of both forward clocking and counter clocking. The counter clock from serializer 640 is synchronized with the data-aligned clock from framer 600 by alignment PLL 720. The output of alignment PLL 720 becomes the reference clock of serializer 640, correcting for PVT and other timing differences through both the framer and the serializer.

The flexibility provided by configuring timing and synchronization circuit 700 according to any of the embodiments represented by FIGS. 8A through 8C allows the system designer to implement the system and later decide which configuration provides optimum performance. The availability of parts, the need to release the framer for production, the cost of re-configuring ICs, and the cost of several versions of PC boards are all factors that make the flexibility provided by circuit 700 desirable. Circuit 700 also provides clock synchronization that accounts for PVT and other timing delays through framer 600 and/or serializer 640.

Other embodiments are within the following claims. Also, while particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method for synchronizing clocks comprising:
    producing an up-converted clock from a system clock, the up-converted clock having a frequency that is a multiple of the frequency of the system clock;
    producing an aligned clock from a data-aligned clock from a first device and a counter clock from a second device;
    selecting a first reference clock to send to the first device from the up-converted clock and the aligned clock; and
    selecting a second reference clock to send to the second device from the up-converted clock and the aligned clock.

2. The method of claim 1, further comprising de-jittering the up-converted clock.

3. The method of claim 1, further comprising de-jittering the aligned clock.

4. The method of claim 1, wherein the aligned clock is selected as the first reference clock to send to the first device.

5. The method of claim 4, wherein the up-converted system clock is selected as the second reference clock to send to the second device.

6. The method of claim 1, wherein the aligned clock is selected as the second reference clock to send to the second device.

7. The method of claim 1, wherein the first device is a CMOS integrated circuit and the second device is a GaAs integrated circuit.

8. The method of claim 1, wherein the system clock is 38.880 MHz, the up-converted system clock is one of 155.520 MHz and 622.080 MHz, the aligned clock is 622.080 MHz and the de-jittered clock is 155.520 MHz.

9. The method of claim 1, wherein the method is performed in a communication circuit disposed in a synchronous optical network (SONET).

10. An apparatus for synchronizing clocks comprising:
    a system PLL circuit configured to produce an up-converted clock from a system clock, the up-converted clock having a frequency that is a multiple of the frequency of the system clock;
    an alignment PLL circuit configured to produce an aligned clock from a data-aligned clock from a first device and a counter clock from a second device;
    a de-jitter PLL circuit configured to produce a de-jittered clock from the up-converted clock or the aligned clock;
    a first selection circuit configured to select a first reference clock to send to the first device from one of the up-converted clock, the aligned clock and the de-jittered clock; and
    a second selection circuit configured to select a second reference clock to send to the second device from one of the up-converted clock, the aligned clock and the de-jittered clock.

11. The apparatus of claim 10, wherein the aligned clock is selected as the first reference clock to send to the first device.

12. The apparatus of claim 11, wherein the up-converted system clock is selected as the second reference clock to send to the second device.

13. The apparatus of claim 10, wherein the de-jittered clock is selected as the second reference clock to send to the second device.

14. The apparatus of claim 10, wherein the aligned clock is selected as the second reference clock to send to the second device.

15. The apparatus of claim 10, wherein the first device is a CMOS integrated circuit and the second device is a GaAs integrated circuit.

16. The apparatus of claim 10, wherein the system clock is 38.880 MHz, the up-converted system clock is one of 155.520 MHz and 622.080 MHz, the aligned clock is 622.080 MHz and the de-jittered clock is 155.520 MHz.

17. The apparatus of claim 10, wherein the apparatus is a communication circuit disposed in a synchronous optical network (SONET).

18. The apparatus of claim 10, wherein the first device is a framer implemented in a CMOS application specific integrated circuit (ASIC) and the second device is a serializer implemented in a GaAs device.

19. A communication system comprising:
- means for producing an up-converted clock from a system clock, the up-converted clock having a frequency that is a multiple of the frequency of the system clock;
- means for producing an aligned clock from a data-aligned clock from a first device and a counter clock from a second device;
- means for producing a de-jittered clock from one of the up-converted clock and the aligned clock;
- means for selecting a first reference clock to send to the first device from one of the up-converted clock, the aligned clock and the de-jittered clock; and
- means for selecting a second reference clock to send to the second device from one of the up-converted clock, the aligned clock and the de-jittered clock.

20. The communication system of claim 19, wherein the aligned clock is selected as the first reference clock to send to the first device such that timing differences between the first device and the second device due to process, voltage, and temperature (PVT) variations and set up and hold time differences are reduced.

21. The communication system of claim 20, wherein the up-converted system clock is selected as the second reference clock to send to the second device.

22. The communication system of claim 19, wherein the de-jittered clock is selected as the second reference clock to send to the second device such that timing differences between the first device and the second device due to process, voltage, and temperature (PVT) variations are reduced.

23. The communication system of claim 19, wherein the aligned clock is selected as the second reference clock to send to the second device such that timing differences between the first device and the second device due to set up and hold time differences are reduced.

24. The communication system of claim 19, wherein the first device is a CMOS integrated circuit and the second device is a GaAs integrated circuit.

25. The communication system of claim 19, wherein the system clock is 38.880 MHz, the up-converted system clock is one of 155.520 MHz and 622.080 MHz, the aligned clock is 622.080 MHz and the de-jittered clock is 155.520 MHz.

26. The communication system of claim 19, wherein the communication system is disposed in a synchronous optical network (SONET).

27. The communication system of claim 19, wherein the first device is a framer implemented in a CMOS application specific integrated circuit (ASIC) and the second device is a serializer implemented in a GaAs device.

* * * * *